US011123958B2

(12) United States Patent
Sargeant et al.

(10) Patent No.: US 11,123,958 B2
(45) Date of Patent: Sep. 21, 2021

(54) PAPER/PLASTIC LAMINATE AND ELECTROMAGNETIC SHIELDING MATERIAL

(71) Applicant: Chase Corporation, Westwood, MA (US)

(72) Inventors: Jeffrey Adams Sargeant, Cumberland, RI (US); Jonathan Bowden, Charlton, MA (US); Bradlee W. Gustavesen, Upton, MA (US); Harold James Klei, Uxbridge, MA (US); James E. Lordi, Wallingford, CT (US); Adam Chase, Westwood, MA (US)

(73) Assignee: Chase Corporation, Westwood, MA (US)

(*) Notice: Subject to any disclaimer, the term of this patent is extended or adjusted under 35 U.S.C. 154(b) by 0 days.

(21) Appl. No.: 15/879,232

(22) Filed: Jan. 24, 2018

(65) Prior Publication Data

US 2018/0236751 A1 Aug. 23, 2018

Related U.S. Application Data

(63) Continuation of application No. 14/680,660, filed on Apr. 7, 2015, now abandoned, which is a continuation
(Continued)

(51) Int. Cl.
*B32B 15/08* (2006.01)
*B32B 29/00* (2006.01)
(Continued)

(52) U.S. Cl.
CPC ............... *B32B 15/08* (2013.01); *B32B 7/12* (2013.01); *B32B 15/09* (2013.01); *B32B 15/20* (2013.01); *B32B 27/10* (2013.01); *B32B 27/32* (2013.01); *B32B 27/36* (2013.01); *B32B 29/002* (2013.01); *H05K 9/0043* (2013.01); *H05K 9/0084* (2013.01); *B32B 2255/06* (2013.01);
(Continued)

(58) Field of Classification Search
None
See application file for complete search history.

(56) References Cited

U.S. PATENT DOCUMENTS 3,671,310 A 6/1972 Brown
4,215,167 A 7/1980 Borden
(Continued)

FOREIGN PATENT DOCUMENTS

CA 2366836 8/2000
CA 2086812 4/2002
(Continued)

OTHER PUBLICATIONS

Chen Yong-liang et al., "Mechatronic cross-coupling modeling and design method for five-rollers solventless coating system," Chinese Journal of Engineering Design, vol. 21, No. 1, Feb. 2014, pp. 1-6.
(Continued)

*Primary Examiner* — Chinessa T. Golden
(74) *Attorney, Agent, or Firm* — Fish & Richardson P.C.

(57) ABSTRACT

A laminate material comprising a paper web and a polymeric film adhered to the paper web, the polymeric film comprising a biodegradable polymeric material that includes an organic additive.

7 Claims, 7 Drawing Sheets

Related U.S. Application Data of application No. 14/467,778, filed on Aug. 25, 2014, now abandoned.

(51) Int. Cl.

| | | |
|---|---|---|
| *B32B 15/20* | (2006.01) | |
| *B32B 27/10* | (2006.01) | |
| *B32B 27/32* | (2006.01) | |
| *B32B 7/12* | (2006.01) | |
| *B32B 15/09* | (2006.01) | |
| *B32B 27/36* | (2006.01) | |
| *H05K 9/00* | (2006.01) | |

(52) U.S. Cl.
CPC ....... *B32B 2255/10* (2013.01); *B32B 2255/12* (2013.01); *B32B 2307/212* (2013.01); *B32B 2457/00* (2013.01); *B32B 2519/02* (2013.01)

(56) References Cited

U.S. PATENT DOCUMENTS

| | | | |
|---|---|---|---|
| 4,647,714 A | 3/1987 | Goto | |
| 5,244,702 A | 9/1993 | Finestone et al. | |
| 5,518,799 A | 5/1996 | Finestone et al. | |
| 5,565,252 A | 10/1996 | Finestone et al. | |
| 5,613,610 A | 3/1997 | Bradford | |
| 5,670,015 A | 9/1997 | Finestone et al. | |
| 5,786,064 A | 7/1998 | Finestone et al. | |
| 5,830,548 A | 11/1998 | Andersen et al. | |
| 5,962,099 A | 10/1999 | Bloch et al. | |
| 6,099,956 A | 8/2000 | Jones | |
| 6,153,288 A | 11/2000 | Shih | |
| 6,235,386 B1 | 5/2001 | Bloch et al. | |
| 6,348,246 B1 | 2/2002 | Finestone et al. | |
| 6,652,984 B2 | 11/2003 | Finestone et al. | |
| 6,673,465 B2 | 1/2004 | Lordi | |
| 6,699,541 B2 | 3/2004 | Finestone et al. | |
| 6,706,388 B2 | 3/2004 | Finestone et al. | |
| 6,797,395 B2 | 9/2004 | Finestone et al. | |
| 6,926,968 B2 | 8/2005 | Lordi | |
| 2001/0007694 A1 | 7/2001 | Ottersbach et al. | |
| 2001/0014392 A1 | 8/2001 | Bloch et al. | |
| 2002/0068136 A1 | 6/2002 | Finestone et al. | |
| 2002/0110675 A1 | 8/2002 | Finestone et al. | |
| 2002/0110684 A1 | 8/2002 | Finestone et al. | |
| 2002/0160216 A1 | 10/2002 | Finestone et al. | |
| 2003/0113564 A1 | 6/2003 | Noda et al. | |
| 2004/0105993 A1 | 6/2004 | Finestone et al. | |
| 2004/0166344 A1 | 8/2004 | Finestone et al. | |
| 2004/0197504 A1 | 10/2004 | Finestone et al. | |
| 2004/0197512 A1 | 10/2004 | Gavel et al. | |
| 2004/0209024 A1 | 10/2004 | Finestone et al. | |
| 2005/0031887 A1 | 2/2005 | Finestone et al. | |
| 2005/0139338 A1 | 6/2005 | Shibatani | |
| 2005/0274472 A1* | 12/2005 | Steif | D21H 21/34 162/159 |
| 2006/0254815 A1 | 11/2006 | Humphrey et al. | |
| 2007/0040653 A1 | 2/2007 | Potts et al. | |
| 2007/0080233 A1 | 4/2007 | Foster et al. | |
| 2008/0000987 A1 | 1/2008 | Augustinowicz et al. | |
| 2008/0186186 A1 | 8/2008 | Campbell | |
| 2009/0047533 A1 | 2/2009 | Warchol | |
| 2009/0096703 A1 | 4/2009 | Chase et al. | |
| 2011/0097548 A1* | 4/2011 | Bhandari | B32B 27/304 428/164 |
| 2013/0337530 A1 | 12/2013 | Lake | |

FOREIGN PATENT DOCUMENTS

| | | |
|---|---|---|
| CA | 2437388 | 8/2002 |
| CN | 1348411 | 5/2002 |
| CN | 1501860 | 6/2004 |
| DE | 69330871 | 5/2002 |
| EP | 0398672 | 5/1990 |
| EP | 0987100 | 3/2000 |
| EP | 0619181 | 10/2001 |
| EP | 1881445 | 1/2008 |
| ES | 2164067 | 2/2002 |
| JP | 06305085 | 11/1994 |
| JP | 2000-272225 | 10/2000 |
| JP | 2002537447 | 11/2002 |
| JP | 2004-188215 | 7/2004 |
| JP | 2004-529825 | 9/2004 |
| JP | 2005-153241 | 6/2005 |
| JP | 2005-169825 | 6/2005 |
| JP | 2006-127555 | 5/2006 |
| MX | 01008543 | 8/2000 |
| MX | 03007052 | 8/2002 |
| RU | 2226467 | 4/2004 |
| WO | WO1993/08674 | 4/1993 |
| WO | WO2000/50234 | 8/2000 |
| WO | WO2002/064365 | 8/2002 |
| WO | WO2006/005984 | 1/2006 |
| WO | WO2008/008203 | 1/2008 |
| WO | WO2008/144336 | 11/2008 |
| WO | WO 2016/032428 | 3/2016 |

OTHER PUBLICATIONS

Office Action in corresponding Application No. 201510527048.2 dated Apr. 28, 2019, pp. 1-9.

Written Opinion and International Search Report in corresponding PCT Application No. PCT/US2014/052531, dated Feb. 9, 2015, pp. 1-10.

International Search and Written Opinion, PCT/US08/63595, dated Sep. 2, 2008, 3 pages.

International Search Report, PCT/US2009/060460, dated May 3, 2010, 8 pages.

* cited by examiner

PAPER/PLASTIC LAMINATE AND ELECTROMAGNETIC SHIELDING MATERIAL

CROSS-REFERENCE TO RELATED APPLICATIONS

This application is a continuation application and claims priority under 35 U.S.C. § 120 to U.S. patent application Ser. No. 14/680,660, filed on Apr. 7, 2015, which is a continuation application that claims priority to U.S. patent application Ser. No. 14/467,778, filed on Aug. 25, 2014, the entirety of each of which is incorporated herein by reference.

TECHNICAL FIELD

The disclosure generally relates to tear-resistant paper and is more particularly directed to a paper/plastic film laminate wherein the polymeric film is biodegradable. The disclosure also relates to materials that are electromagnetically opaque and, more particularly, to materials that provide electromagnetic shielding.

BACKGROUND

Durable papers are designed to perform well in challenging environments. One such paper employs at least one paper surface laminated to a sheet or film of polymeric material. In some instances the polymeric material is sandwiched between two pieces of paper. Such laminates offer superior tear resistance and durability.

RFID ("radio frequency identification") device shielding is another area where paper has been employed. Increasingly, it has been easier to read important information from credit cards and/or passports that incorporate readable RFID devices simply by the card and/or passport being in proximity to an RFID card reader. In some instances the card and/or passport can be read while in the owner's bag, pocket or wallet. This can lead to such things as identity theft. To combat this, envelopes, sleeves and the like that incorporate RFID shielding have been used.

Because such sleeves and envelopes may likely be used repeatedly over extended periods of time, the above-described paper/plastic material may provide a solution.

SUMMARY

In some aspects, a laminate material includes a paper web and a polymeric film adhered to the paper web. The polymeric film includes a biodegradable polymeric material that includes an organic additive.

Embodiments can include one or more of the following.

In some aspects, a laminate material includes a paper web and a polymeric film having a top surface and a bottom surface. The top surface of the polymeric film is bonded to a bottom surface of the paper web by a first adhesive. The laminate material also includes a layer of conductive material with a thickness of at least $2 \times 10^{-7}$ inches. The layer of conductive material has a top surface and a bottom surface. The top surface of the layer of conductive material is bonded to the bottom surface of the polymeric film by a second adhesive. The laminate material is configured to shield radiation having frequencies from 125 kHz to at least 3 GHz.

Embodiments can include one or more of the following.

The polymeric film includes polyester.

The layer of conductive material includes one or both of aluminum and copper.

One or both of the first adhesive and the second adhesive is a 100% solids adhesive.

One or both of the first adhesive and the second adhesive is solid.

One or both of the first adhesive and the second adhesive is a water-based adhesive.

One or both of the first adhesive and the second adhesive is a solvent-based adhesive.

The paper web includes a filler material capable of providing a particular visual property of the paper web.

In some additional aspects, a laminate material includes a first paper web and a polymeric film having a top surface and a bottom surface. The top surface of the polymeric film is bonded to a bottom surface of the first paper web by a first adhesive. The laminate material also includes a layer of conductive material with a thickness of at least $2 \times 10^{-7}$ inches. The layer of conductive material has a top surface and a bottom surface. The top surface of the layer of conductive material is bonded to the bottom surface of the polymeric film by a second adhesive. The laminate material also includes a second paper web having a top surface that is bonded to the bottom surface of the layer of conductive material by a third adhesive. The laminate material is configured to shield radiation having frequencies from 125 kHz to at least 3 GHz.

Embodiments can include one or more of the following.

The polymeric film includes polyester.

The layer of conductive material includes one or both of aluminum and copper.

One or more of the first, second, and third adhesives is a 100% solids adhesive.

One or more of the first, second, and third adhesives is solid.

One or more of the first, second, and third adhesives is a water-based adhesive.

One or more of the first, second, and third adhesives is a solvent-based adhesive.

One or both of the first paper web and the second paper web includes a filler material capable of providing a particular visual property of the respective paper web.

In some additional aspects, a security device capable of electromagnetically shielding an RFID smart chip includes a dimensionally stable electromagnetic shielding laminate material. The dimensionally stable electromagnetic shielding laminate material includes a paper web and a layer of conductive material. The layer of conductive material has a thickness of at least $2 \times 10^{-7}$ inches. The layer of conductive material has a top surface and a bottom surface. The top surface of the layer of conductive material is bonded to a bottom surface of the paper web by a first adhesive. The security device also includes a substrate positioned adjacent to the dimensionally stable electromagnetic shielding laminate material. The dimensionally stable electromagnetic shielding laminate material is configured to shield radiation having frequencies from 125 kHz to at least 3 GHz.

Embodiments can include one or more of the following.

The layer of conductive material includes one or both of aluminum and copper.

The security device also includes a polymeric film having a top surface and a bottom surface. The top surface of the polymeric film is bonded to the bottom surface of the layer of conductive material by a second adhesive.

The polymeric film includes polyester.

One or both of the first adhesive and the second adhesive is a 100% solids adhesive.

One or both of the first adhesive and the second adhesive is solid.

One or both of the first adhesive and the second adhesive is a water-based adhesive.

One or both of the first adhesive and the second adhesive is a solvent-based adhesive.

The paper web includes a filler material capable of providing a particular visual property of the paper web.

The substrate is one or more of wallpaper, paper of an envelope, a sleeve, a passport sleeve, a sheath, a holder, and a folder into which the RFID smart chip can be inserted.

The details of one or more embodiments of the invention are set forth in the accompanying drawings and the description below. Other features, objects, and advantages of the invention will be apparent from the description and drawings, and from the claims.

DETAILED DESCRIPTION OF THE INVENTION

In one aspect, the invention provides a monolithic paper/plastic laminate with a paper web laminated to a polymeric film that comprises a biodegradable polymeric material. The laminate is uniformly bonded and is made using an adhesive and remains dimensionally stable to changes in temperature and loading condition in equipment employing heat set fuser toner adhesion as the method for fusing/binding ink to paper. For example, the laminate can remain dimensionally stable against shrinkage, unwanted curl, or unwanted bending. Depending upon the desired application for the paper/plastic laminate, the paper web and the polymeric film can have a range of characteristics. In one embodiment, a second paper web is laminated to the other side of the polymeric film, sandwiching the polymeric film between two paper webs.

The paper/plastic laminate can be used similarly to regular paper in office midrange and high-speed traditional laser and digital copiers and digital printers, and other like equipment using heat set fuser toner adhesion as the method for fusing/bonding an ink to a paper.

Alternatively, the paper/plastic laminate may have printed matter applied thereon by a variety of methods, including but not limited to, Gravure, Flexographic, Letter Press, or Direct Type processes. In some embodiments, printed images may be applied by ink jet or laser printing, as well. Suitable inks for printing the image include, but are not limited to, solvent or water-based inks, acrylic inks, soy inks and ultra-violet ("UV") inks. In some embodiments, the paper/plastic laminate has an appearance and a texture consistent with regular papers. The polymeric film layer, however, gives the paper/plastic laminate resistance against tearing.

The paper web has a surface that permits writing or printing to be placed thereon using conventional writing implements, printing equipment and/or inks, and it is adapted to permit the paper/plastic laminate to be used with the equipment identified above. The characteristics of the paper web can be tailored, similarly to regular paper, by conventional processes well known to those skilled in the art of papermaking. Characteristics commonly adjusted are dimensional stability in the presence of heat, opacity, brightness, pH, water resistance, and acid content. The paper web should also be formulated to be compatible with the polymeric film and the laminating process discussed below. In the laminating process an adhesive is applied between the paper web and the polymeric film.

The polymeric film can be made with any biodegradable polymeric material. The polymeric film material is selected not only for its ability to be adhered to the paper web, but also for its dimensional stability, both shrinkage and distortion, in the presence of heat.

Figure 1:
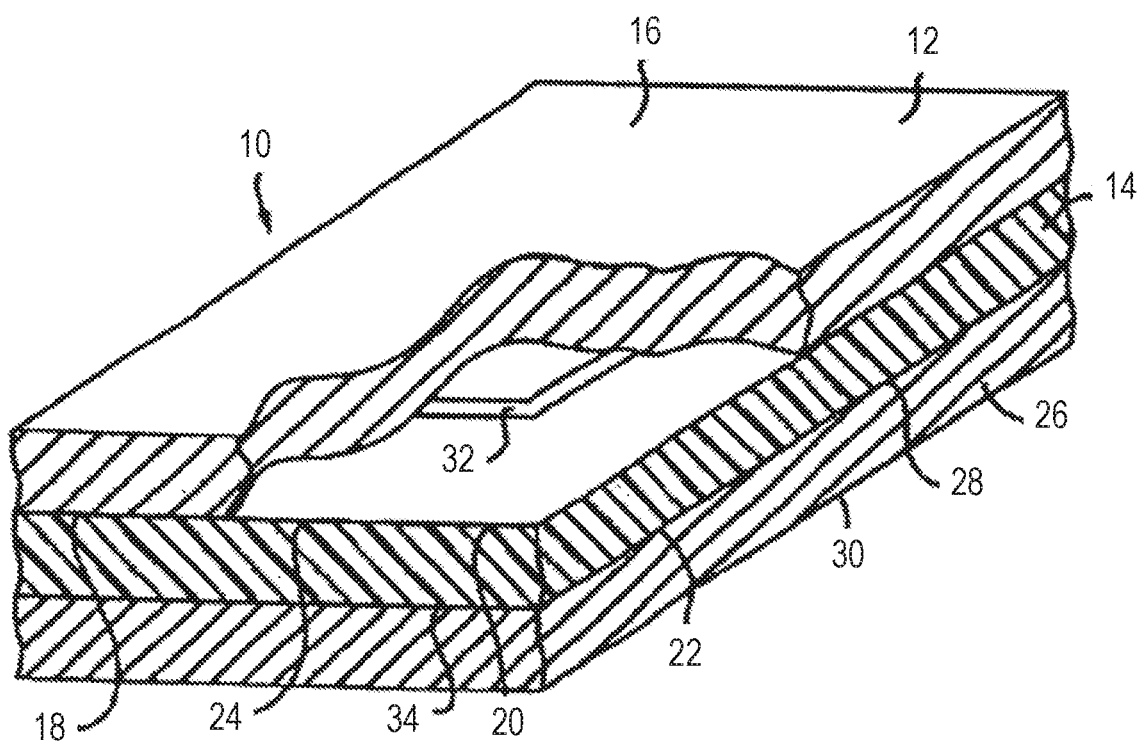
FIG. 1 is an enlarged perspective view of the paper/plastic laminate of the present invention.

The laminating process positions an adhesive between the paper web and the polymeric film and then laminates the paper web to the polymeric film. In some embodiments, a paper/plastic laminate as described herein is made using a 100% solids adhesive. As used herein, a "100% solids adhesive" means an adhesive employing 100% solids adhesives technology as differentiated from solvated adhesives and waterborne adhesives. In one embodiment, a 100% solids adhesive comprises a tie layer of polyethylene that is laminated between, and adjacent to, the paper web and the polymeric film. Alternatively, the adhesive may be a curable urethane adhesive, as describe further below. Optionally, the paper/plastic laminate can be assembled in an extrusion lamination process in which the polymeric film and/or the adhesive layer are extruded during the process As shown in FIG. 1 a paper/plastic laminate embodying the present invention, generally referred to by the reference number 10, includes a paper web 12 and a polymeric film 14. The paper web 12 has a first surface 16 (i.e., a "top" surface, as seen in FIG. 1) and a second surface 18 (i.e., a "bottom" surface). The polymeric film 14 has a first surface 20 (i.e., a top surface) and a second surface 22 (i.e., a bottom surface). The polymeric film 14 comprises a biodegradable polymeric material, as discussed further below. The second surface 18 of the paper web 12 is bonded to the first surface 20 of the polymeric film 14 by an adhesive layer 24. In this embodiment, a second paper web 26 having a first surface 28 (i.e., a top surface, as seen in FIG. 1) and a second surface 30 (i.e., a bottom surface) has the first surface 28 adhered to the second surface 22 of the polymeric film 14 via another adhesive layer. A laminating process, discussed infra, adheres the paper web 12, 26 to the polymeric film 14.

The paper web 12 can be formed from a fibrous web formulated with a blend of softwood Kraft, hardwood Kraft and/or recycled fiber. Brightness is a function of the application. A GE brightness value in excess of 83, per TAPPI test method T 452 om-92, is preferred for general writing paper. In premium writing paper, the GE brightness should be around 95, or higher. Conventional optical brightening additives can be used to achieve the desired level of brightness. As those skilled in the art of papermaking will appreciate, selection of the components of the fibrous web affects the brightness of the paper. Alternatively, the paper 12 can be formed from a fibrous web formulated from a blend including FSC—(Forest Sustainability Council) certified paper. Generally considered different from recycled paper, FSC-certified paper is typically composed of virgin tree fibers rather than pre- or post-consumer recycled materials (although recycled paper is sometimes also FSC-certified).

While the paper 12 has been described as being formed from a fibrous web formulated from a blend of softwood Kraft, hardwood Kraft, FSC-certified, and/or recycled paper, the present invention is not limited in this regard, as other materials known to those skilled in the art can be utilized instead of, or in combination with, the aforesaid papers.

The filler content in the paper web is adjusted to provide the opacity desired. For general paper applications, an opacity of at least about 77 percent is suitable, but a minimum opacity of 79 percent is desired. However, the present invention is not limited in this regard as any other desired opacity, including about 0% opacity, can be provided without departing form the broader aspects of the present invention. The caliper of the paper web can be selected by one of ordinary skill in the art to suit the intended use of the paper/plastic laminate and/or the paper handling capabilities of the laminating equipment.

In certain applications water resistance as well as wet strength may be desired. Water resistance can be achieved by use of a conventional internal sizing additive. A conventional wet strength additive may also be incorporated to Increase wet rub resistance. Sizing methods and the amount of sizing, as well as wet strength additives are well understood in the art. Water resistance can also be achieved through the application of a suitable water resistant and/or hydrophobic coating. Such coatings may be applied through a variety of techniques, such as three roll reverse, gravure, and five roll coating, to name a few.

The polymeric film 14 comprises a biodegradable polymeric material. The polymeric film 14 can be made from polyethylene, high density polyethylene, low density polyethylene, polyester, polyethylene terephthalate, monoaxially oriented polypropylene, biaxially oriented polypropylene, among other materials. In an example, a polymeric film in a laminate described herein may be made from a natural biodegradable polymer such as a polylactide, e.g., a polylactic acid polymer (PLA) which is biodegradable. One suitable PLA film is available from BI-AX International, Inc., 596 Cedar Ave, Wingham, ON NOG 2WO Ontario, Canada, under the trade name Evlon. Other biodegradable polymer PLA films that can be used in the shielding material described herein are commercially available from SKC Inc., 1000 SKC Drive, Covington, Ga. 30014, USA, under the designations SKYWEL TE90, BC11C, TE75, and TE71C.

Alternatively, the polymeric material of the polymeric film may comprise a biodegradable polyolefin (e.g., polyethylene (PE) or polypropylene (PP)) or a biodegradable polyester, such as a polyolefin or polyester that includes a biodegradation additive to render the polymer material biodegradable. The biodegradation additive causes a reduction in the average molecular weight of the polymeric material to a molecular weight at which microbial biodegradation of the polymer material can occur, e.g., to a weight average molecular weight of about 10,000 grams per mole, or less. Biodegradation can occur in compost or in a landfill. One type of biodegradation additive comprises a catalyst which catalyzes the oxidative degradation of a polyolefin material to a reduced average molecular weight, at which biological processes can further break down the polyolefin material. Such a degradation process is referred to as oxo-biodegradation. The effect of such a catalyst can be activated by ultraviolet (UV) light and/or heat, thereby accelerating breakdown of the polyolefin material. A number of such catalysts are commercially available under the trade designation "Reverte™" from Wells Plastics Ltd, Emerald Way, Stone Business Park, Stone, Staffordshire, ST15 OSR, UK, e.g., via the distributor Oxobioplast, Inc., which has a place of business at 120 Eglinton Ave. East, Suite 1100, Toronto, ON, Canada M4P 1E2. Masterbatch polymer materials that contain Reverte™ catalysts are commercially available, and the addition of about 1 to about 5% by weight of the masterbatch material to a standard polyolefin yields the biodegradation effect. A number of such catalysts are also commercially available from Symphony Environmental, 7235 Bonneval Road, Jacksonville, Fla. 32256. Oxo-biodegradable PP films are also commercially available, e.g., Envirosafe LCF 502E oxo-biodegradable PP, distributed by Multi Plastics, Inc., 777 North Central Drive, Lewis Center, Ohio 43035.

Alternatively, the polymeric material of the polymeric film may comprise an organic additive that renders the film degradable upon exposure to certain microbial organisms, such as oleophilic bacteria. Such organic additives do not require oxygen, UV light, or heat to biodegrade. Rather, such organic additives cause plastic to biodegrade as a result of being consumed by the microbial organisms. One such organic additive is available under the trade designation "Eco-One™" from Ecologic LLC, 601 Oregon Street, Suite A, Oshkosh, Wis. 54902.

While UV/heat-activated and microbial organism-activated biodegradation additives have been mentioned, the invention is not limited in this regard, and in other embodiments, the biodegradable polymeric material for the polymeric film may contain any other type of additive capable of rendering the polymeric material biodegradable.

Factors in the selection of polymeric film 14 material include dimensional stability, shrinkage, balance, and heat resistance. Polymeric film 14 properties generally vary by material gauge. Present polymeric films 14 employed in the manufacture of paper/plastic laminates of 25-lb. paper (500 sheets, 17 inch by 22 inch sheets) have gauges of about 118 (approx. 30 micron).

Optionally, the first surface 20 of the polymeric film 14 may include at least one printed image 32, as shown in FIG. 1. The printed image 32 may include one or more colors and be of any desired design. In some embodiments, especially those including a second paper web 26 adhered to the second surface 22 of the polymeric film 14, may include a second printed image 34 on the second surface 22 of the polymeric film. The second printed image 34 may be applied in the same, or different, manner as the printed image 32 on the first surface 20. Preferably, each printed image 32, 34 is visible through the paper web 12, 26 once the laminating process, discussed infra, is complete.

While any suitable adhesive may be employed to bond the layers of the paper/plastic laminate 10, in one embodiment, the laminating process used to adhere the paper web 12, 26 to the polymeric film 14 uses a 100% solids adhesive. The laminating process produces a destructive bond between the paper web 12, 26 and the polymeric film 14. A destructive bond is defined as a bond between the paper web 12, 26 and the polymeric film 14 that after curing under a T Peel Adhesion Test will not allow the paper web 12, 26 to be separated from the polymeric film 14 with the paper web 12,26 remaining intact.

The 100% solids, or solventless, adhesive used in the present invention is a low temperature (flowable at room temperature at about 100 degrees F.) two-component adhesive or a warm one-component adhesive (an adhesive that is a gel at room temperature and that is heated to permit the adhesive to flow). The selection of adhesive is based on the adhesive penetration and holdout characteristics of the paper web. Generally, the warm temperature adhesive is used where the adhesive penetration and the holdout of the paper web is a concern. The low temperature adhesive is used when adhesive penetration and holdout of the paper web are less of an issue. Each adhesive properly used should produce the desired destructive bond.

Lamination is accomplished using standard lamination techniques. The adhesive can be applied directly to the paper web and/or the polymeric film prior to lamination. While the adhesive might be heated to enhance its flow characteristics, the paper web and the polymeric film are not heated, except incidentally by contact with the warmed adhesive, if any. The adhesive cures without the addition of heat. Where a second paper web is to be laminated to the other side of the polymeric film, some curing time for the first bond should be allowed for.

In a specific embodiment, the 100% solids adhesive comprises a curable two-component urethane laminating adhesive that is prepared by combining a polyol resin with an isocyanate cross-linking agent and a UV-initiated cross-linking catalyst or accelerator to provide a curable resin. The lamination process includes layering the polymeric film and the paper web with the curable resin between the paper web and the polymeric film, pressing the paper web, polymeric film and curable resin together, and exposing the laminate to UV light. Whereas prior art paper/plastic laminates could only be prepared using papers that exhibited low absorbency, the use of the described curable resin permits the manufacture of satisfactory paper/plastic laminates from papers that exhibit a wide range of absorbencies. In particular, the prior art (as seen, for example, in U.S. Pat. No. 6,673,465 and U.S. Pat. No. 6,926,968) required that the paper web 12 be resistant to adhesive penetration and allow sufficient holdout to degrees balanced to allow maximum surface contact, or wetting out. A sufficient level of surface sizing or coating applied through any of several conventional techniques was used to minimize the penetration of the adhesive into the paper web 12. Sizing or coatings such as starch, PVA or Latex. AKD (Alkyl Ketene Dimer) sizing in combination with starch sizing was found to provide suitable adhesion penetration and holdout for a non-acid paper web 12. However, by using a curable two-component urethane laminating adhesive as described herein to bond the paper web to the polymeric film, the choice of paper web need not be resistant to adhesive penetration and exhibit holdout as required by the prior art.

In operation, and as described above, the polymeric film 14 is laminated to a single paper web 12 or may be embedded between two layers of the paper web 12, 26, whereby the printed image 32, 34 is protected. As a result, the polymeric film 14 having a printed image 32, 34 thereon is not accessible to be altered without destroying the paper/plastic laminate 10. In addition, the differences between the original paper/plastic laminate 10 and a typical photocopy or digital scan is evident to the naked eye. Therefore, a document having security features can be created without alterations or special features being added to the paper.

To facilitate use of some embodiments of the paper/plastic laminate in office equipment using heat set fuser toner adhesion as the method for fusing/bonding an ink to a paper (e.g., in midrange and high-speed traditional laser and digital copiers and digital printers, and other like equipment), the paper and the polymeric film are selected for their thermal characteristics in addition to other criteria, because the ink binding processes in such equipment can generate significant heat, e.g., 375 degrees F. or higher. A paper web 12 suited for these applications will be one that can withstand the temperature extremes of the process while maintaining its dimensional properties. The paper may have a surface 16, 30 treated with a metal salt such as sodium salt and more specifically sodium nitrate or sodium chloride. In one embodiment, the paper web is treated with sodium nitrate at the rate of 50 pounds per 1000 pounds of starch, a rate approximately 30 percent greater than typical treatments for standard xerographic paper. Biodegradable polyester films are suitable for paper/plastic laminates to be used with such equipment, whereas the temperatures reached in the printing processes are sufficient to curl and/or to shrink paper/plastic laminates containing some other types of polymeric films. Therefore, the polymeric film is selected not only for its strength, but also for its thermal characteristics. In one embodiment, the polymeric film 14 may comprise a biodegradable polyester and may have a mechanical strength exceeding about 29,000 psi, approximately 2004 Kg/mm2, in all directions measured using ASTM D 882. Thermal heat shrinkage should be less than about 2 percent using the SKC Method (this is an internal measurement of SKC, Inc. of Covington, Ga.), 150 degrees C. for 30 minutes.

In another broad aspect, the present invention provides an electromagnetic shielding material that comprises a polymeric film and that includes at least one layer of electrically conductive material. The polymeric film contains a biodegradable polymeric material as described further herein. Optionally, the electromagnetic shielding material is a laminate of the polymeric film with at least one paper web. The layer of conductive material may constitute a distinct ply that is adhered to the plastic film in a laminate. For example, the conductive material may be provided as a metal foil or a woven metal fabric, or deposited as a metalizing later on the polymeric material. Alternatively, the layer of conductive material may be provided as particles of conductive material that are incorporated into the polymeric film. Including a biodegradable material in the shielding material accelerates the biodegradation of the shielding material once the shielding material is discarded.

Figure 1A:
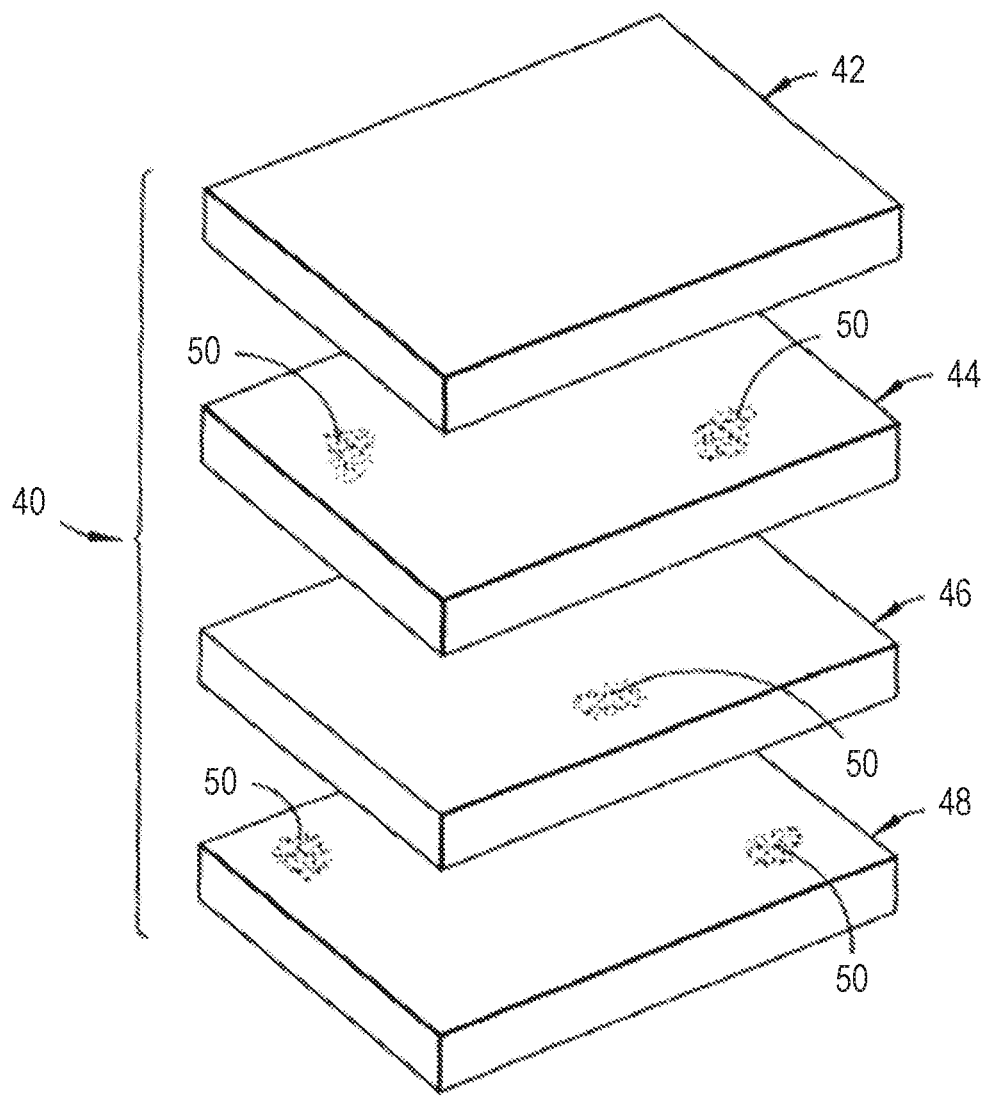
FIG. 1A is an exploded perspective view of an electromagnetic shielding material of the present invention.

Referring to FIG. 1A, one embodiment of an electromagnetic shielding material is shown generally at 40. The electromagnetic shielding material 40 is a four-ply laminate material
comprising a first paper web 42, a polymeric film 44 comprising a biodegradable polymeric material as described herein, a conductive layer 46, and a second paper web 48. Adjacently positioned surfaces of each of the first paper web 42, the polymeric film 44, the conductive layer 46, and the second paper web 48 are adhered to each other using an adhesive 50.

Both the first paper web 42 and the second paper web 48 comprise fibrous web materials. In one embodiment, such web materials are formulated with but are not limited to one or more of natural fiber (such as cotton), synthetic fiber, and/or recycled fiber. Also, such web materials include fillers that are suitable to provide at least some of the desired opacity. Coloring may be added to one or both of the first paper web 12 and the second paper web 18 as desired. The paper may also be synthetic or artificial paper or the like. The paper may be coated or uncoated.

The conductive layer 46 comprises any suitable conductive material. In FIG. 1A, the conductive layer 46 is shown as a distinct ply in the laminate. For example, the conductive layer 46 may be a metal foil sheet of a thickness suitable to cause the interruption, interference, or impedance of radio signals proximate thereto. The metal foil also imparts some degree of opacity to the electromagnetic shielding material 40. In such an embodiment, the metal used is aluminum, although other metals (e.g., copper, silver, nickel, and the like in elemental or alloy form) are within the scope of the present invention. The use of metal in foil form allows the electromagnetic shielding material 40 to better accommodate a folded configuration.

In another embodiment, the conductive layer 46 may comprise metallic particles deposited onto one or more of the polymeric film 44 and the second paper web 48. The metallic particles may be aluminum (e.g., elemental aluminum), aluminum alloys, or aluminum-containing compounds, or they may comprise other metals (e.g., copper, silver, nickel, and the like). In still another embodiment, the conductive layer 46 may be woven or non-woven strands of metal.

In yet other embodiments, the conductive layer 46 may comprise a non-metallic material such as carbon, carbon-loaded matrix material, graphite, combinations of the foregoing, and the like. Carbon nanotubes may also be used either in single-walled form or double-walled form. In embodiments in which carbon nanotubes are used as the conductive layer 46, the carbon nanotubes can be deposited using any suitable technique such as chemical vapor deposition or the like to afford precise control of the thickness of the conductive layer.

In yet another embodiment, the adhesive 50 may be conductive in itself. In such an embodiment, the adhesive includes a suitable conductive material mixed therein. Such elements include, but are not limited to, metals in the forms of films, foils, particles, powders, granules, beads, combinations of the foregoing, and the like. The metals may be aluminum (e.g., elemental aluminum), aluminum alloys, or aluminum-containing compounds, or they may be other metals (e.g., copper, silver, nickel, gold, silver, and the like). Foils of a variety of gauges can be used, including but not limited to 35 ga, 48 ga, and 100 ga, to name a few.

The adhesive 50 used to adhere the first paper web 42, the polymeric film 44, the conductive layer 46, and the second paper web 48 into a laminated form may be a 100% solids adhesive. The present invention is not limited in this regard as other adhesives are within the scope of the present invention. In particular, the adhesive 50 may be solvent-based, water-based, a hot melt, ultraviolet radiation curable, electron beam curable, combinations of the foregoing, and the like.

When a 100% solids adhesive is used in laminating the first paper web 42, the polymeric film 44, the conductive layer 46, and the second paper web 48, a destructive bond is produced between the paper webs and the polymeric film. A destructive bond is one in which the paper web(s) and the polymeric film, after curing under a T Peel Adhesion Test, will not allow the paper web(s) to be separated from the polymeric film with the paper remaining intact.

Figure 2:
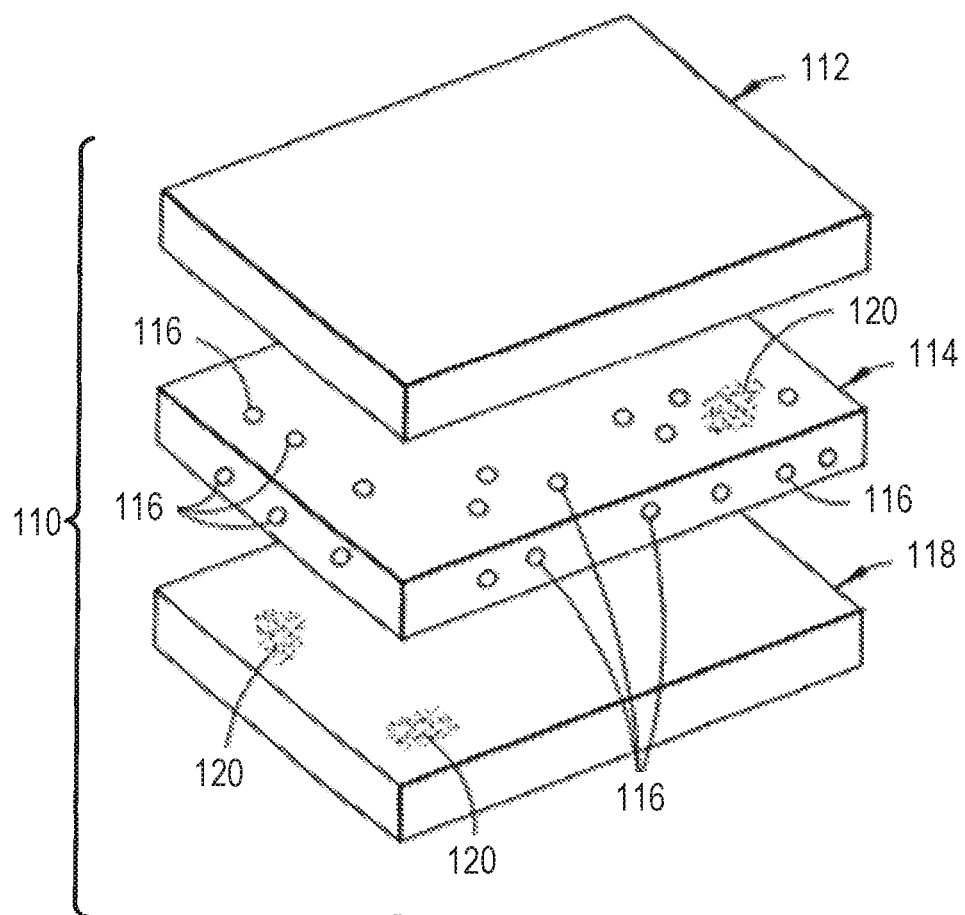
FIG. 2 is an exploded perspective view of another embodiment of an electromagnetic shielding material of the present invention.

Referring now to FIG. 2, another embodiment of an electromagnetic shielding material is shown generally at 110. The electromagnetic shielding material 110 is a laminate material comprising a first paper web 112, a polymeric film 114, a conductive material 116, and a second paper web 118. The first paper web 112 and the polymeric film 114 are adjacently positioned and adhered to each other using an adhesive 120. The conductive material 116 is impregnated into or otherwise incorporated into the polymeric film 114 to define a metalized polymeric film, which thereby obviates the need to adhere the conductive material to the polymeric film. The second paper web 118 is adhered to the polymeric film 114 (incorporating the conductive material 116) using the adhesive 120.

In the electromagnetic shielding material 110, both the first paper web 112 and the second paper web 118 comprise fibrous web materials (similar to the previous embodiment), and the polymeric film 114 comprises a biodegradable polymeric material.

Figure 3:
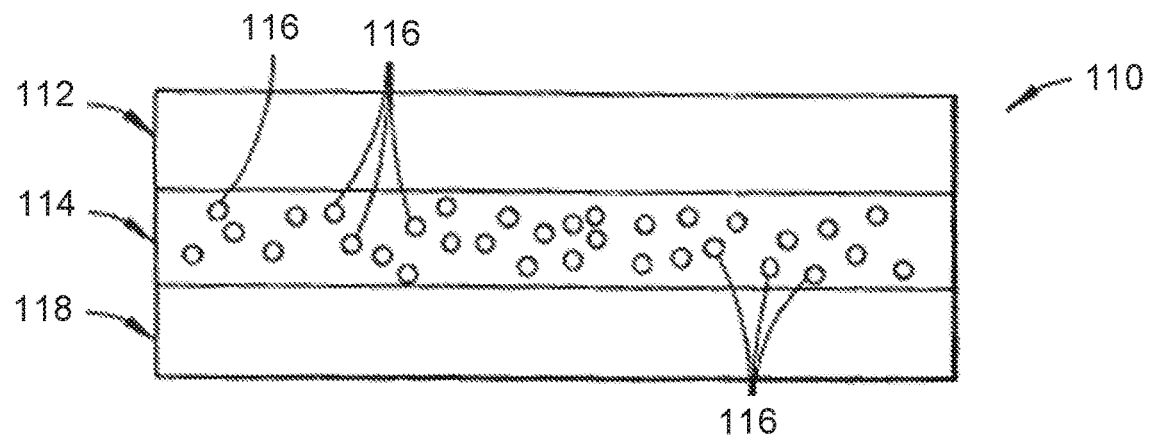
FIG. 3 is a side sectional view of another embodiment of an electromagnetic shielding material of FIG. 2.
Figure 4:
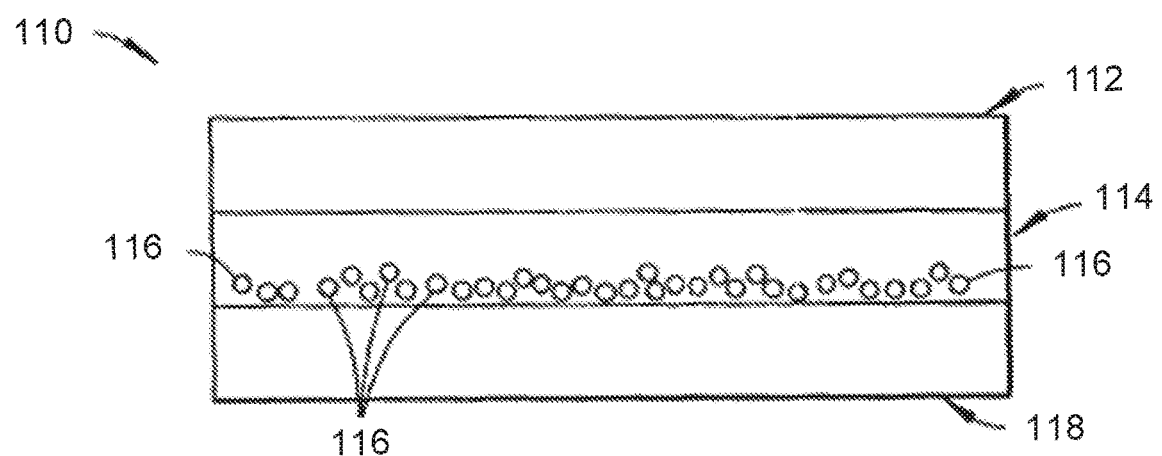
FIG. 4 is a side sectional view of another embodiment of an electromagnetic shielding material of FIG. 2.

The conductive material 116 in the electromagnetic shielding material 110, however, comprises particles of suitable conductive material such as aluminum, copper, silver, nickel, alloys thereof, or the like in powder form. Non-metallic materials such as carbon, carbon-loaded matrix material, graphite, carbon nanotubes, combinations of the foregoing, combinations of the foregoing with metal, and the like may also be used. In such an embodiment, the conductive material 116 may be dispersed uniformly throughout the polymeric film 114 as shown in FIG. 3, or it may be concentrated along one surface of the polymeric film as shown in FIG. 4.

Figure 5:
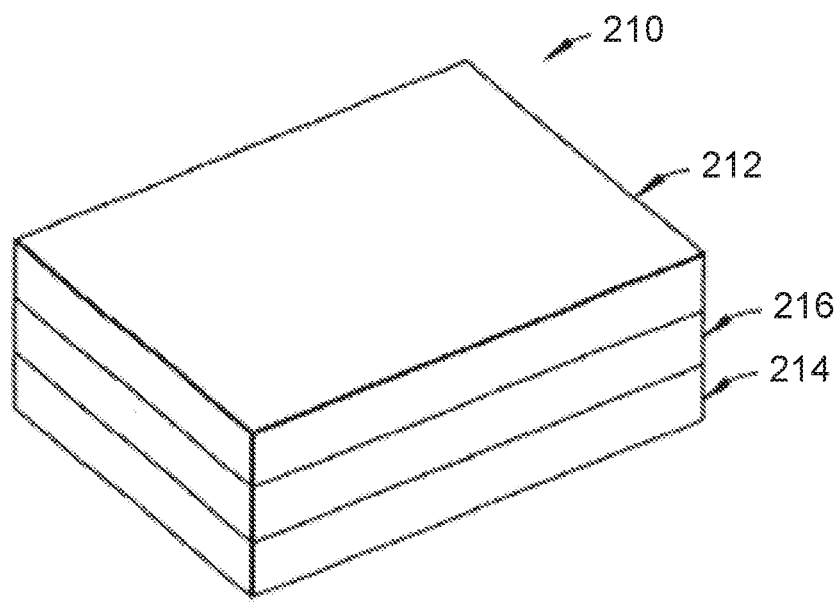
FIG. 5 is a perspective view of another embodiment of an electromagnetic shielding material of the present invention.

Referring now to FIG. 5, another embodiment of an electromagnetic shielding material is shown generally at 210. The electromagnetic shielding material 210 is a three-ply laminate material comprising a paper web 212, a polymeric film 214, and a conductive material 216. The polymeric film 214 comprises a biodegradable polymeric material. The conductive material 216 is sandwiched between the paper web 212 and the polymeric film 214. The present invention is not limited in this regard, however, as either the paper web 212 or the conductive material 216 may be sandwiched between the other two layers. An adhesive is used to adhere the three plies of the electromagnetic shielding material 210 together. The conductive material 216 may be aluminum, copper, silver, nickel, alloys of the foregoing, combinations of the foregoing, or the like. The conductive material 216 may also be carbon, carbon nanotubes, carbon-loaded matrix material, graphite, combinations thereof, combinations thereof with metal, or the like.

Figure 6:
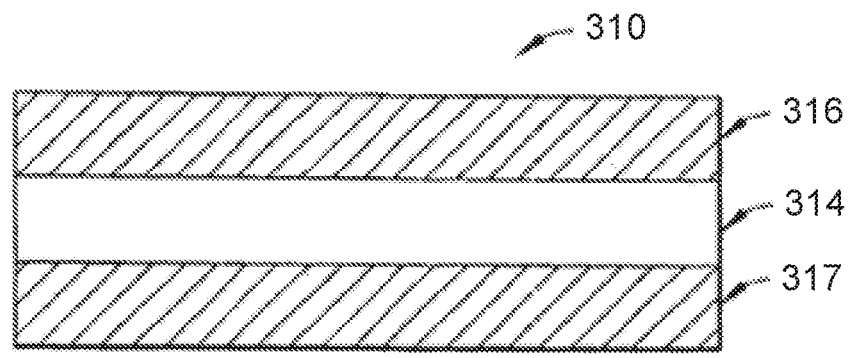
FIG. 6 is a sectional view of a 3-ply electromagnetic shielding material in which a polymeric film is sandwiched between layers of a conductive material.
Figure 7:
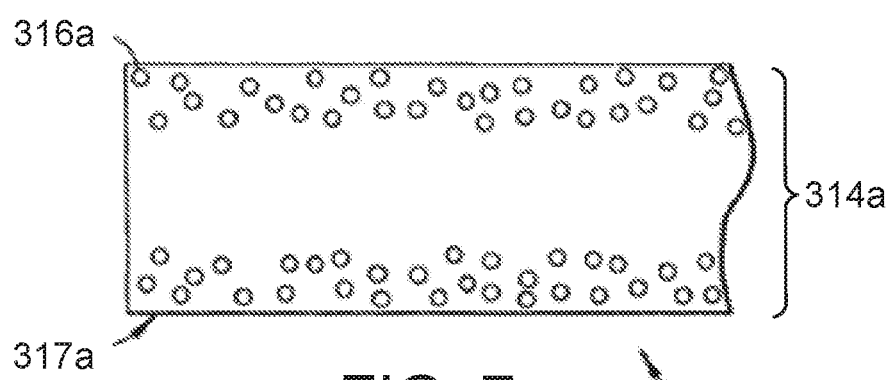
FIG. 7 is a side view of the another electromagnetic shielding material in which layer of conductive material is incorporated into a polymeric film.

Referring now to FIG. 6, another embodiment of an electromagnetic shielding material is shown generally at 310. This electromagnetic shielding material 310 is a three-ply laminate material comprising a polymeric film 314 sandwiched between a first conductive material 316 and a second conductive material 317. The polymeric film 314 comprises a biodegradable polymeric material. In the electromagnetic shielding material 310, both the first conductive material 316 and the second conductive material 317 are aluminum foils. The present invention is not limited in this regard, however, as the materials from which both the first conductive material 316 and the second conductive material 317 are fabricated may be any conductive material such as aluminum, copper, silver, nickel, alloys thereof, or the like in powder form. Non-metallic materials such as carbon, carbon-loaded matrix material, graphite, carbon nanotubes, combinations of the foregoing, and the like may also be used. In the electromagnetic shielding material 310, the first conductive material 316 and the second conductive material 317 may both be adhered to opposing surfaces of the polymeric film 314. In another embodiment shown in FIG. 7, and electromagnetic shielding material 310a comprises a polymeric film 314a that comprises a biodegradable polymeric material. Particles of a first conductive material 316a and of a second conductive material 317a are incorporated directly into the polymeric film 314a and concentrated substantially along the facing surfaces thereof.

In some implementations, other types of properties and characteristics may be incorporated into the laminate (e.g., the paper/plastic laminate 10 presented in FIG. 1). For example, one or more layers of the laminate (e.g., the paper web 12 or 26, the polymeric film 14, the electromagnetic shielding material, etc.) may be adjusted for achieving other capabilities. In one implementation, one or more coating such as a digital coating or water resistant coating maybe incorporated into one or more of the laminate layers. For example, the paper/plastic laminate may be produced with a digital coating, a water resistant coating, a combination of the two coatings, etc. by using a solvent based, water based, or one or more solid coatings through an electron beam or ultraviolet (UV) photo initiated cure. Such coatings may be applied through a variety of techniques such as three roll reverse, gravure, five roll coating, etc. In some cases, incorporation of the coating, characteristics of the coating, etc. may be selected based upon the application chosen for the laminate.

Offset gravure, direct gravure, etc. may be the selected choice of coating head when applying a solvent base digital coating. Generally, a gravure roll would directly contact the surface of the material depositing the dispersion of the digital ink adhesion promoter, water resistant material, solvents, other additives, etc. The material may then be carried through an oven flashing off the solvents and leaving the digital ink adhesion promoters, water resistant material, etc. bonded to the surface of the paper/plastic laminate.

In one arrangement, a three roll reverse coating head may be used to apply the water based emulsion. The material would pass through a three roll reverse coating head leaving a thin coating that enhances adhesion of the inks through a digital press, make the paper surface water resistant, etc. A sensor may be implemented to determine the amount of the coating deposited on the paper web and the roll speeds on the coating head may be adjusted to maintain the required deposition. In some arrangements, only a thin surface coating is provided to both sides of the material, while in other arrangements a relatively thicker coating or coatings may be employed.

Other types of coating may be applied using one or more techniques or methodologies. For example, a five roll coating may be used to apply a two component 100% solids coating, a single component UV coating, etc. Typically, such coatings may travel through four or five rolls, in which each roll may be rotated at a different speed to control the amount deposited on the paper web by the fifth roll. In some arrangements, the coating may then travel through either an electron beam chamber, under UV focused lights, etc. that may immediately react with the coating to produce a solid that is bonded to the surface of the paper/plastic laminate.

Coatings may also be applied that reduce the probability of scraping or marking the surfaces of the paper/plastic laminate. For example, one or more anti-scuff or anti-scratch coatings, slip resistant coatings, etc. may be applied. Such coatings may be water-based or solvent-based. In general, such coatings could be similar to a digital coating or water resistant coating in that they may be applied to the surface of the paper/plastic laminate. However some anti-scuff, slip resistant, etc. coatings may need relatively larger amounts of coating material deposited compared to the digital receptive coatings. By employing five roll coating, UV curing, electron beam curing, or similar techniques, higher viscosity and heavier coating weights may be achieved. Other techniques that may be employed that allow for heavier coating application include a knife over roll technique, saturation techniques, extrusion coating, and squeeze roll.

Coatings may also be applied that increase the receptivity of the surfaces of the paper/plastic laminate to printing and marking inks. Such coatings can be either applied as a topcoat to the finished laminate or alternatively can be added during the initial manufacturing of the stock materials used to make the laminate.

Coatings may also be applied that increase the water, grease and/or oil resistance of the surfaces of the paper/plastic laminate. Such coatings enhance the longevity and service life of the laminate by preventing the surface of the laminate from being damaged by water, grease, or oil. Such coatings can be applied by any of the methods described above.

For some paper/plastic laminate embodiments, other types of properties may be incorporated, for example one property (e.g., antimicrobial) may be capable of destroying or inhibiting the growth of disease-causing microorganisms. Various antimicrobial agents can be incorporated into the paper/plastic laminate (e.g., as a coating), such as antibacterial agents, antifungal agents, antiviral agents, and antiparasitic agents, to name a few. Flame resistant properties may also be incorporated into the paper/plastic laminate. For some arrangements, surface treatments to the paper/plastic laminate may not be sufficient to incorporate such properties. For example to provide a flame resistant material, the adhesive layer of the polymeric film may need flame retardant additives to hinder flame propagation as some polymeric films can be flammable. The amount of additives may vary, for example, a flame resistant film may be produced that slows flammability based upon the amount of additives. In some applications, flame retardant additives may not be incorporated into the polymeric film. Rather the flame retardant additives may be incorporated in one or more adhesives. In some arrangements, the paper substrates (e.g., paper web 12 shown in FIG. 1) may be applied with flame retardant additives as well. To apply such additives, techniques describes above with respect to other capabilities (e.g., digital printing, water resistance, anti-scuff and slip resistant coatings, etc.) may be used alone, in concert with other techniques, or other techniques may be employed.

For paper/plastic laminates that include an antimicrobial property, one or more of the layers (e.g., paper web, polymeric film, etc.) may be coated, have additives applied, etc. for the laminate to be resistant to microbes. For example, the polymeric film can have one or more antimicrobial additives added during an extrusion process. The adhesive may have one or more additives added during a reaction process, added as filler to a component of the adhesive, etc. The paper layers (e.g., the paper web 12) may have one or more antimicrobial additives coated onto either or both surfaces that may also need to be print receptive to handle further converting of the finished laminate. Other types of capabilities may be incorporated into the paper/plastic laminate in isolation or in combination with one or more of the capabilities (e.g., digital printing, water resistance, anti-scuff and slip resistant coatings, etc.) provided by the incorporated properties discussed above.

Figure 8:
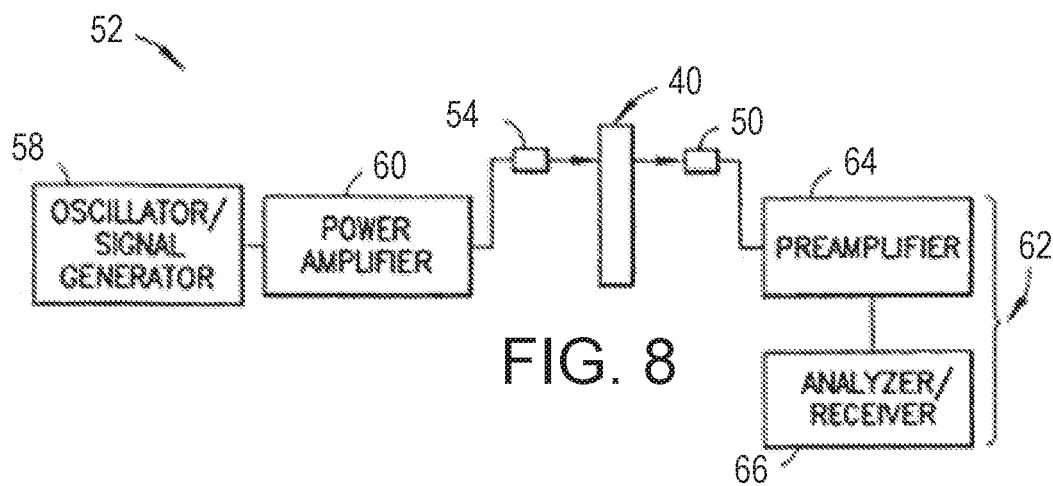
FIG. 8 is a schematic representation of an RFID reading of an electromagnetic shielding material of the present invention.

Referring now to FIG. 8, the shielding effectiveness of the electromagnetic shielding material 40 of RFID radiation is shown generally at 52. Although the electromagnetic shielding material is shown as being the four-ply laminate material comprising the polymeric film and the conductive layer clad in paper webs, the present invention is not limited in this regard as any of the other electromagnetic shielding materials disclosed herein can be used with the apparatus depicted.

To provide for effective shielding, the electromagnetic shielding material 10 is interposed between a transmitting antenna 54 and a receiving antenna 56. A signal generator 58 outputs an unmodulated sinusoidal RF signal at discrete frequencies into a power amplifier 60. The signal generator 46 is incremented at the discrete frequencies (13.56 MHz) with predetermined amplitudes fed into the power amplifier 60 and through the transmitting antenna 54. The resulting planewave signal is field-propagated into the electromagnetic shielding material 40. Depending upon the exact configuration of a device into which the electromagnetic shielding material 40 is incorporated, the propagated signal is preferably not received by the receiving antenna 56 attached to an RFID receiving portion 62, which comprises a preamplifier 64 and an analyzer 66 located in a chip.

The electromagnetic shielding material 40 can shield radiation at a number of frequencies. In some arrangements, the electromagnetic shielding material 40 can shield radiation having frequencies from 3 Hz to 300 GHz, including frequencies in the following bands: ELF (3-30 Hz), SLF (30-300 Hz), ULF (300-3,000 Hz), VLF (3-30 kHz), LF (30-300 kHz), MF (300-3,000 kHz), HF (3-30 MHz), UHF (300-3,000 MHz), SHF (3-30 GHz), and EHF (30-300 GHz). Properties of the electromagnetic shielding material 40 can define the radiation frequencies that the electromagnetic shielding material 40 is able to shield. Such properties include the conductive material used, the conductive pattern used, the sealing technique employed, and the frequency selective surface (FSS) employed. For example, a particular pattern of meshes employed in the conductive material can determine the shielding properties of the shielding material 40.

Figure 9:
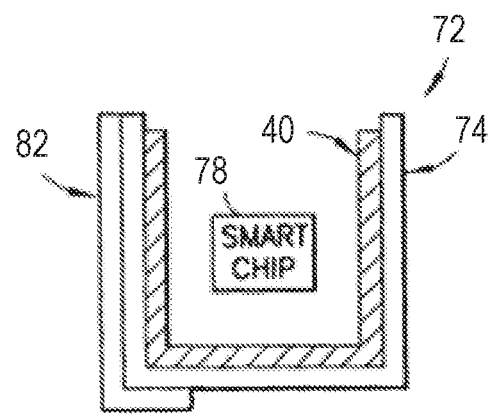
FIG. 9 is a schematic representation of a device incorporating the electromagnetic shielding material of the present invention.
Figure 10:
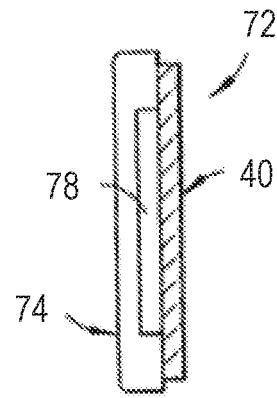
FIG. 10 is a schematic representation of another embodiment of a device incorporating the electromagnetic shielding material of the present invention.

Referring now to FIGS. 9 and 10, a security device into which the electromagnetic shielding material 40 of the present invention is incorporated is shown generally at 72. In FIG. 9, the security device 72 may be an envelope (e.g., a secure mailing envelope, a fulfillment mailer, or the like), a protective sleeve, sheath, holder, wallpaper, RFID machine scannable cards (e.g., bank cards, transit cards, telephone cards, or the like), medical packaging, or the like. When the security device 72 is an envelope, protective sleeve, holder, etc., it may be fabricated from a piece of electromagnetic shielding material 40 that is cut, folded, and suitably glued. The security device 72 and the electromagnetic shielding material 40 may take any of a number of forms depending on the device into which the RFID smart chip is incorporated.

In addition to the electromagnetic shielding material 40, the security device includes an adjacently-positioned substrate 74. The substrate 74 may be the paper, cardboard, polymer, or other material of the envelope, sleeve, sheath, holder, wallpaper, or the like that contains or shields a smart chip 78 of an RFID system. When the security device 72 is wallpaper, the wallpaper may be backed with vinyl or the like. In any embodiment, the substrate 74 may be incorporated into the structure of another article 82. The article 82 may be a wallet, purse, handbag, pocket protector, article of clothing, suitcase, or computer bag. The article 82 may also be a room or an entire building. Also in any embodiment, the proximity of the electromagnetic shielding material 40 to the smart chip 78 provides effective shielding of the smart chip.

In another embodiment, as shown in FIG. 10, the substrate 74 may be an RFID machine scannable card or the like that directly incorporates the smart chip 66 of the RFID system.

One advantage may be considered that personal information encoded into a device readable via RFID (e.g., an RFID smart chip) cannot be read without the authorization of the owner of the personal information. In particular, the proximity of the electromagnetic shielding material to the smart chip causes sufficient interference with the transmission and receiving of a planewave field-propagated signal to negate the ability of a reader to ascertain the information contained in the smart chip. By negating this ability, a person carrying the device into which an RFID smart chip is incorporated (e.g., a passport, an identification card, a credit card, a transit card or a pre-paid pass, a gift card, or the like) is able to feel confident in his ability to thwart the unauthorized reading of his information encoded onto the device. Codes or information cannot be read without the explicit permission of the user.

In embodiments in which the smart chip is in a small device that can be carried by a person (e.g., in the form of a document), the electromagnetic shielding material of the present invention may be in the form of an envelope, a folder, a sleeve, or a similar paper product in which the device having the RFID smart chip can be held. Additionally, or in the alternative, the electromagnetic shielding material may be in sheet form and held in proximity to the smart chip. In any embodiment, the paper of the envelope, folder, sleeve, or the like can be printed, embossed, colored, cut, perforated and/or folded in any configuration. The paper can also be coated or uncoated. Given the lightweight nature of the paper, most papers are suitable for use in the present invention. In embodiments in which the electromagnetic material is used in an envelope or other document holder, a clear or translucent window may be incorporated into the envelope of other document holder to allow documents to be manually read or viewed without being touched.

In embodiments in which the smart chip is in a device that is relatively large or not easily movable, the electromagnetic shielding material of the present invention may be used to shield packaging or even entire rooms. Particularly with regard to computer hard drives, computer media, and other types of electronics, the packaging thereof can be lined with, coated with, or otherwise incorporated with the electromagnetic shielding material. Such packaging includes, but is not limited to, computer cases, disc cases, boxes, and the like. Other packaging may include drums, totes, pallet wrapping devices, cargo containers, and the like. The electromagnetic shielding material may even be in the form of wallpaper or insulation or other paper that can be used to line ceilings and floors. In embodiments in which the smart chip is in a device that is in transit, such as RFID-labeled inventory, the electromagnetic shielding material of the present invention may be used to shield packaging containing the device.

EXAMPLE 1

Preparation of a Paper/Plastic Laminate

Figure 11:
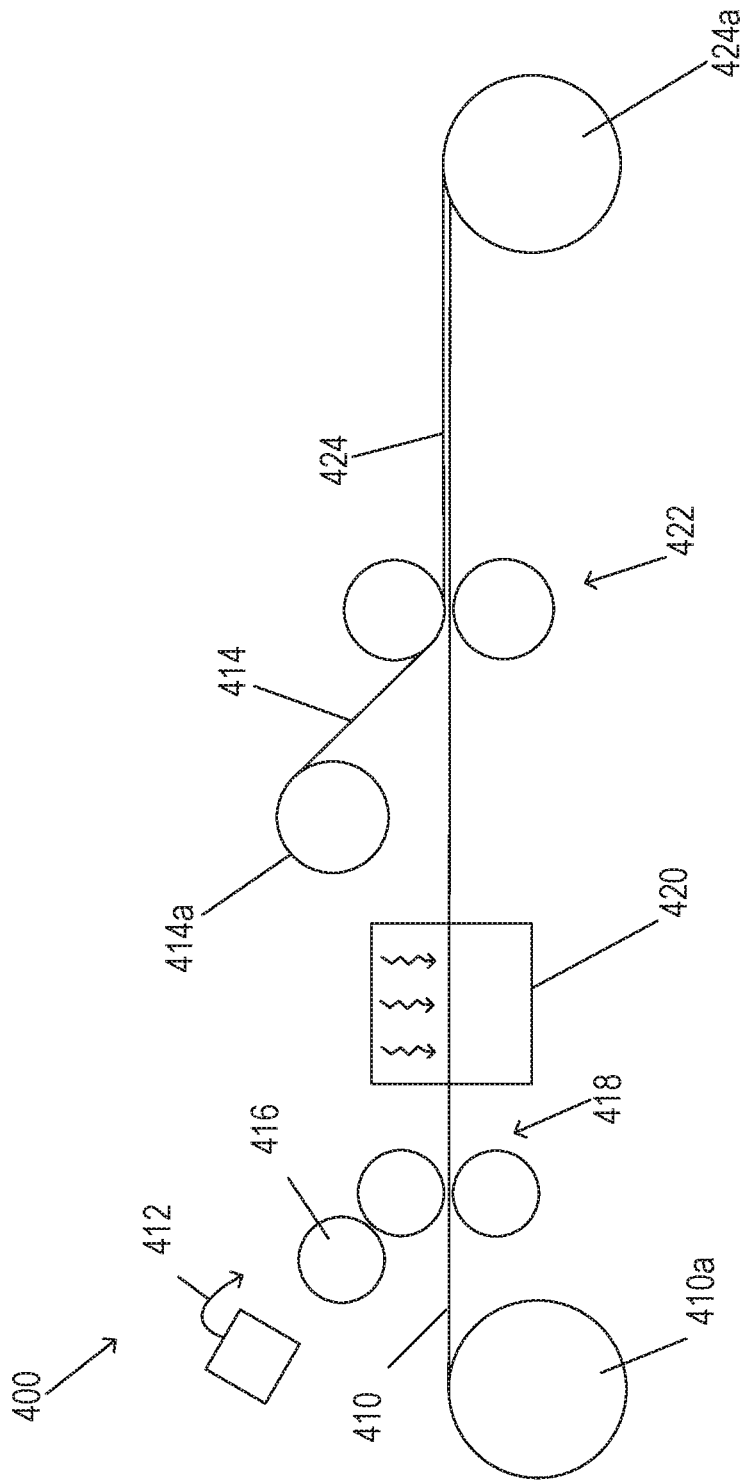
FIG. 11 is a schematic representation of a process for making a paper/plastic laminate according to one embodiment of the invention.

Referring to FIG. 11, wherein one illustrative process for producing a paper/plastic laminate is indicated generally by the numeral 400, a 25-lb. paper/plastic laminate meeting the requirements of the present invention can be made as follows. Provide a supply roll 410a of 118 gauge biodegradable polypropylene (PP) film 410 such XT30B film from the AmTopp division of Inteplast Group, Ltd., of Livingston, N.J. Also provide a supply of curable two component urethane laminating adhesive 412. Provide a supply 414a of 30 GSM (grams per square meter) paper 414 such as Ultrawhite Laminating Base from Domtar of Fort Mill, S.C. A thin coat of the adhesive 412 generated on a calendar roll 416 is transferred to a kiss roll station 418. The PP film 110 is passed through the kiss roll station 418 to deposit the adhesive 412 onto one side of the film. The PP film 110 is then passed through a UV-light station 420 where the film 410 and the adhesive 412 thereon are exposed to UV light at, e.g., about 600 Watts/inch, for a time sufficient to initiate the UV-initiated curing catalyst. The film 410 is then passed through a pinch roller 422 with the paper 414 web to laminate the film to the paper to produce a two-ply paper/plastic laminate 424. The two-ply paper/plastic laminate 424 is collected on a take-up roll 424a. The two-ply paper/plastic laminate 424 is then passed through the kiss roll station 418 to apply adhesive to the second side of the film, and the paper/plastic laminate 424 is then passed through the UV-light station 420 and the pinch roll station 422 to initiate curing and apply a second layer of paper 414, to produce a 3-layer laminate that is collected on a take-up roll.

EXAMPLE 2

Electromagnetic Shielding Material Construction and Effectiveness

Various arrangements of paper web material, non-biodegradable polymeric film, and metal (in foil form or incorporated into the polymeric film) were constructed and tested for shielding effectiveness. The results are set forth in the following table.

| Sample | Construction | Thickness of metal (inches) | Reading using handheld reader/detector (readable/not readable) | Reading based on IEEE-299 shielding effectiveness (decibels) (13.56 MHz test frequency |
|---|---|---|---|---|
| 1 | Paper/film/paper (3 ply) | | Readable | Not tested |
| 2 | Paper/Al-coated film (2 ply) | $3 \times 10^{-7}$ | Readable | Not tested |
| 3 | Paper/Al-foil/film/paper (4 ply) | $3.5 \times 10^{-4}$ | Not readable | 43 |
| 4 | Paper/Al-foil/film (3 ply) | $1 \times 10^{-3}$ | Not readable | 48.67 |
| 5 | Al-foil/film/Al-foil (3 ply) | $3.5 \times 10^{-4}$ $3.5 \times 10^{-4}$ | Not readable | 61 |
| 6 | Paper/Cu-foil/film (3 ply) | $7 \times 10^{-4}$ | Not readable | 43 |

Although the foregoing examples refer to laminates that do not contain biodegradable polymeric materials as described herein, it will be apparent to those of skill in the art that a paper/plastic laminate and a shielding material can be made using a polymeric film that comprises a biodegradable polymeric material as described herein pursuant to Example 1, and that the resulting shielding material would have substantially the same effectiveness as the samples in Example 2.

The terms "first," "second," and the like, herein do not denote any order, quantity, orientation or importance, but rather are used to distinguish one element from another. The terms "a" and "an" herein do not denote a limitation of quantity, but rather denote the presence of at least one of the referenced item.

Although this invention has been shown and described with respect to the detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention not be limited to the particular embodiments disclosed in the above detailed description, but that the invention will include all embodiments falling within the scope of the appended claims.

What is claimed is:
1. A laminate material comprising:
 a paper web on which a flame retardant additive is applied;
 a polymeric film having a top surface and a bottom surface, wherein the top surface of the polymeric film is bonded to a bottom surface of the paper web by a first adhesive; and
 a layer of conductive material made from one or more of aluminum, copper, silver, nickel, gold, or silver, wherein the layer of conductive material has a thickness of at least $2 \times 10^{-7}$ inches, the layer of conductive material having a top surface and a bottom surface, wherein the top surface of the layer of conductive material is bonded to the bottom surface of the polymeric film by a second adhesive;
 wherein the laminate material is coated with an anti-scuff coating and the laminate material is configured to shield radiation having one or more frequencies from 125 kHz to at least 3 GHz,
 wherein the laminate material includes a coating that increases the receptivity of the laminate material to printing and marking inks,
 wherein the laminate material includes a coating that increases the water, grease, and oil resistance of the laminate material, and wherein the laminate material includes an antimicrobial coating that destroys and prevents the growth of microorganisms.

2. The laminate material of claim 1, wherein the polymeric film includes polyester.

3. The laminate material of claim 1, wherein the paper web includes a filler material capable of providing a particular visual property of the paper web.

4. A laminate material comprising:
a paper web;
a polymeric film having a top surface and a bottom surface, wherein the top surface of the polymeric film is bonded to a bottom surface of the paper web by a first adhesive; and
a layer of conductive material with a thickness of at least $2 \times 10^{-7}$ inches, the layer of conductive material having a top surface and a bottom surface, wherein the top surface of the layer of conductive material is bonded to the bottom surface of the polymeric film by a second adhesive;
wherein the laminate material is coated with an anti-scuff coating and the laminate material is configured to shield radiation having one or more frequencies from 125 kHz to at least 3 GHz,
wherein one or both of the first adhesive and the second adhesive includes a conductive metal foil mixed therein,
wherein the laminate material includes a coating that increases the receptivity of the laminate material to printing and marking inks,
wherein the laminate material includes a coating that increases the water, grease, and oil resistance of the laminate material, and
wherein the laminate material includes an antimicrobial coating that destroys and prevents the growth of microorganisms.

5. The laminate material of claim 4, wherein the polymeric film includes polyester.

6. The laminate material of claim 4, wherein the layer of conductive material includes one or both of aluminum and copper.

7. The laminate material of claim 4, wherein the paper web includes a filler material capable of providing a particular visual property of the paper web.

* * * * *